(12) United States Patent
Miyata

(10) Patent No.: US 6,538,317 B1
(45) Date of Patent: Mar. 25, 2003

(54) SUBSTRATE FOR RESIN-ENCAPSULATED SEMICONDUCTOR DEVICE, RESIN-ENCAPSULATED SEMICONDUCTOR DEVICE AND PROCESS FOR FABRICATING THE SAME

(75) Inventor: Koji Miyata, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/536,405

(22) Filed: Mar. 28, 2000

(30) Foreign Application Priority Data

Jul. 30, 1999 (JP) .......................... 11-216108

(51) Int. Cl.$^7$ .................. H01L 23/053; H01L 23/12; H01L 23/14
(52) U.S. Cl. .................. 257/701; 257/787; 257/737; 257/780; 257/784; 438/112; 438/113; 438/114
(58) Field of Search .................. 257/701, 787, 257/780, 784; 438/110, 112–114

(56) References Cited

U.S. PATENT DOCUMENTS

| | | | | |
|---|---|---|---|---|
| 5,814,837 A | * | 9/1998 | Okazaki .................. | 257/91 |
| 5,864,470 A | * | 1/1999 | Shim et al. .................. | 361/777 |
| 5,879,964 A | * | 3/1999 | Paik et al. .................. | 438/113 |
| 5,976,912 A | * | 11/1999 | Fukutomi et al. .................. | 438/110 |
| 6,077,757 A | * | 6/2000 | Mizuno et al. .................. | 438/465 |
| 6,174,751 B1 | * | 1/2001 | Oka .................. | 438/113 |
| 6,200,824 B1 | * | 3/2001 | Hashimoto .................. | 438/15 |
| 6,214,645 B1 | * | 4/2001 | Kim .................. | 438/110 |

FOREIGN PATENT DOCUMENTS

JP          10-92979          4/1998

OTHER PUBLICATIONS

Satoshi Takabayashi et al., Technical Report of IEICE. CPM98–166, Dec. 1998, "FBGA/CSP flexible assembly lines with whole–cavity . . .", pp. 59–65.

* cited by examiner

Primary Examiner—Tom Thomas
Assistant Examiner—Nitin Parekh
(74) Attorney, Agent, or Firm—Nixon & Vanderhye P.C.

(57) ABSTRACT

A substrate for a resin-encapsulated semiconductor device comprises a first region for mounting a plurality of semiconductor chips in which a plurality of patterned wirings, a plurality of first through holes for external connection and lands which cover the entire openings of the first through holes and partially constitute the patterned wirings are formed and a second region in which the semiconductor chips are not mounted, the first and second regions being formed on the same surface, wherein the second region is provided with a plurality of second through holes whose openings are entirely covered with a conductive film.

7 Claims, 14 Drawing Sheets

Fig. 9 (a) (Prior Art)
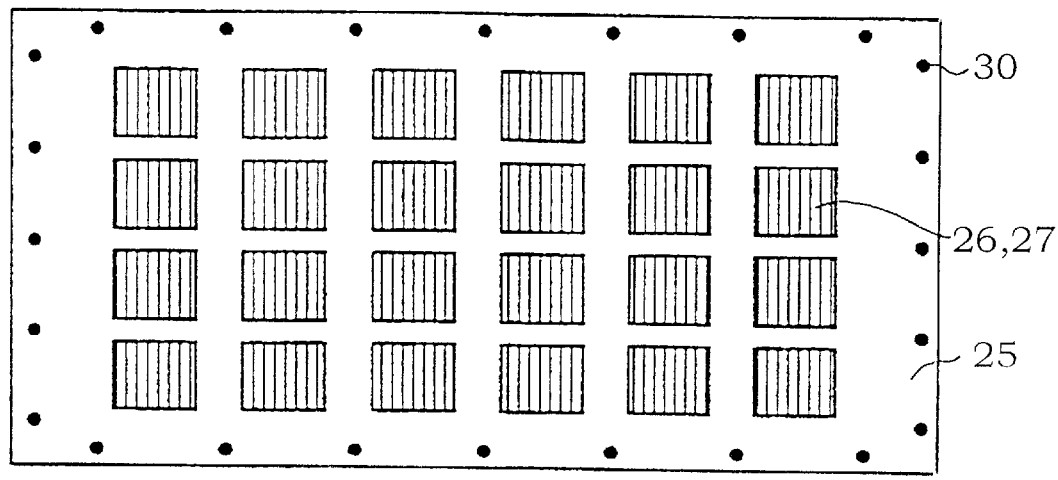
Fig. 9 (b) (Prior Art)
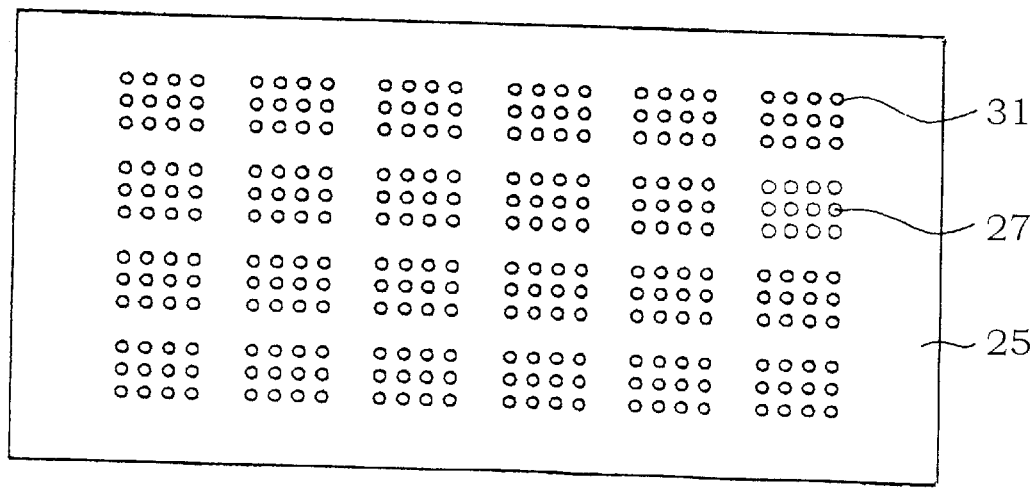

Fig. 10 (a)   (Prior Art)
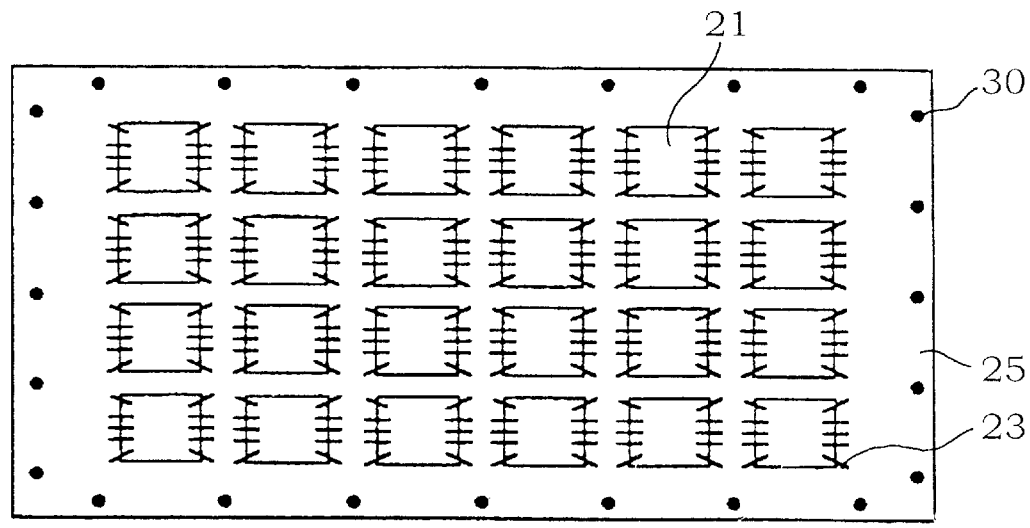
Fig. 10 (b)   (Prior Art)
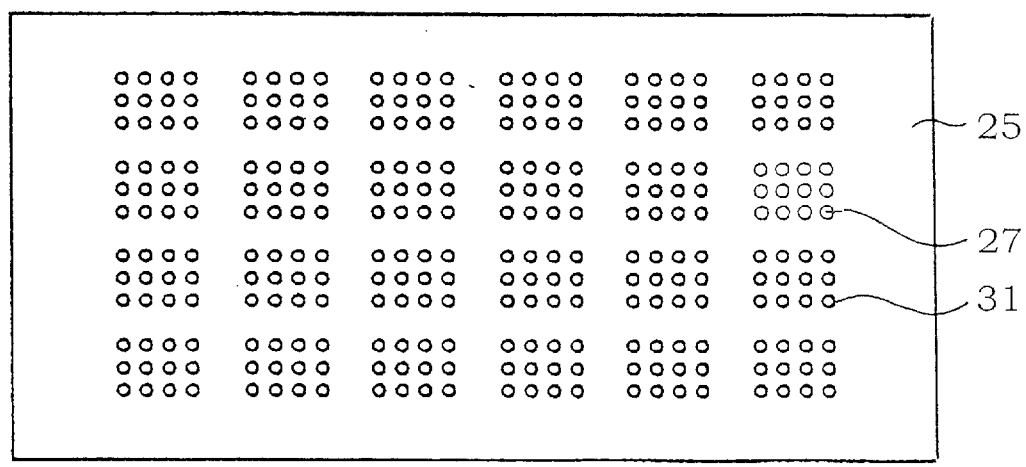

Fig. 11 (a) (Prior Art)
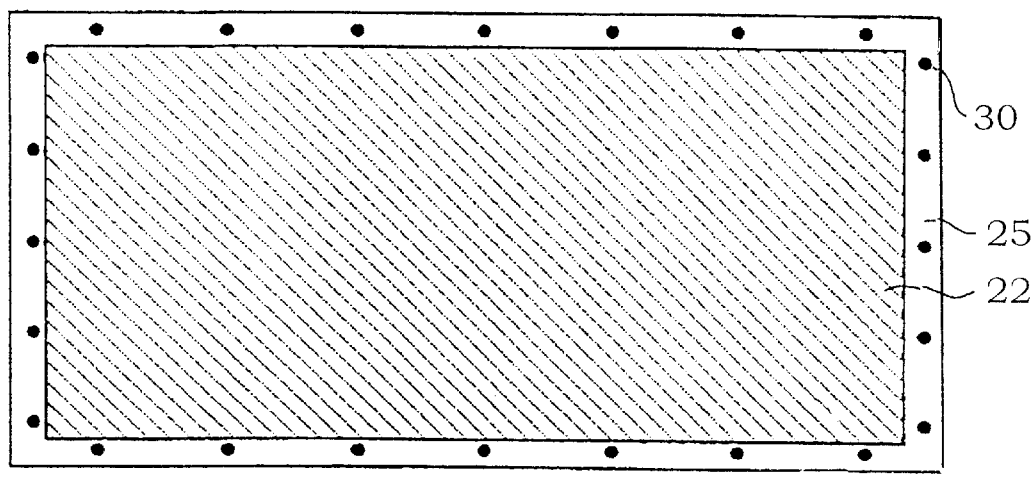
Fig. 11 (b) (Prior Art)
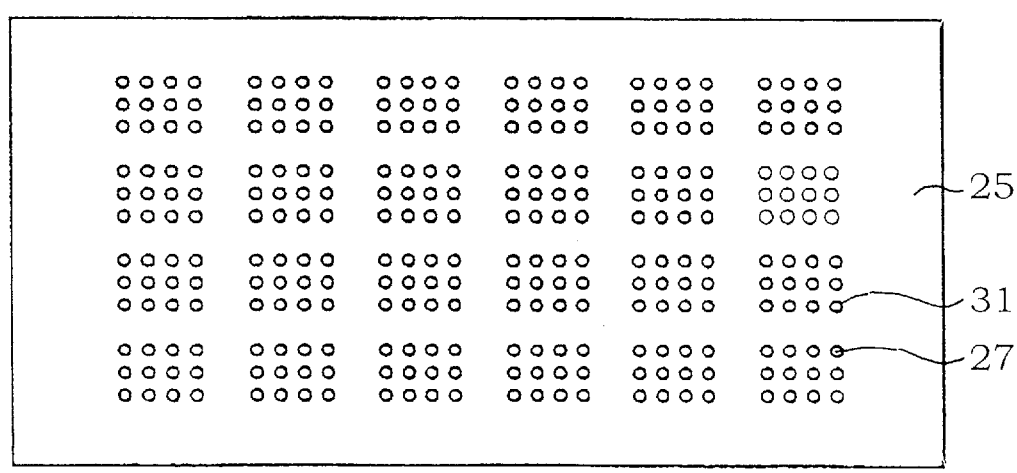

Fig. 12 (a) (Prior Art)
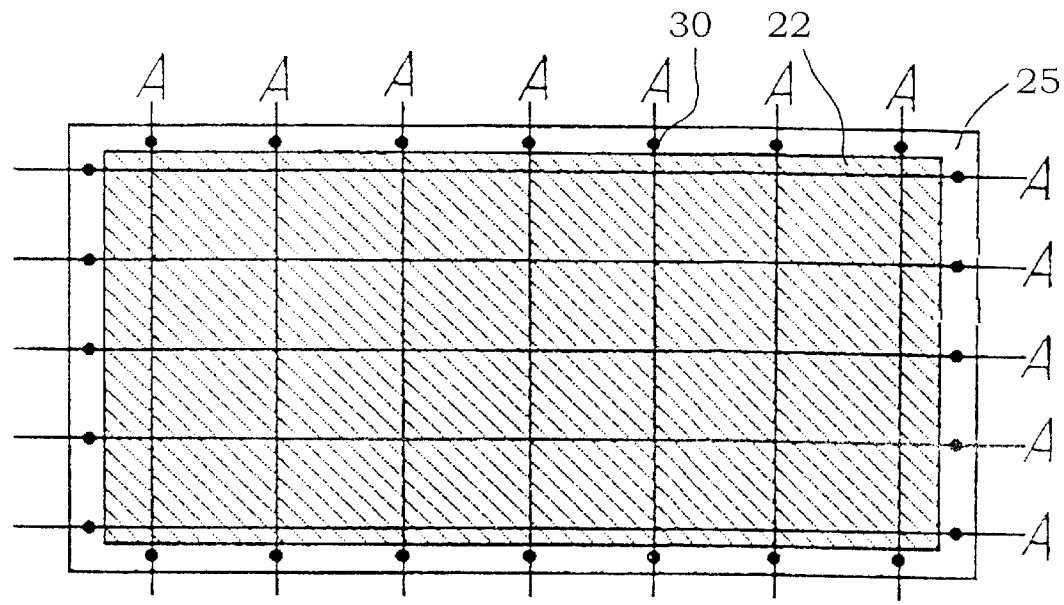
Fig. 12 (b) (Prior Art)
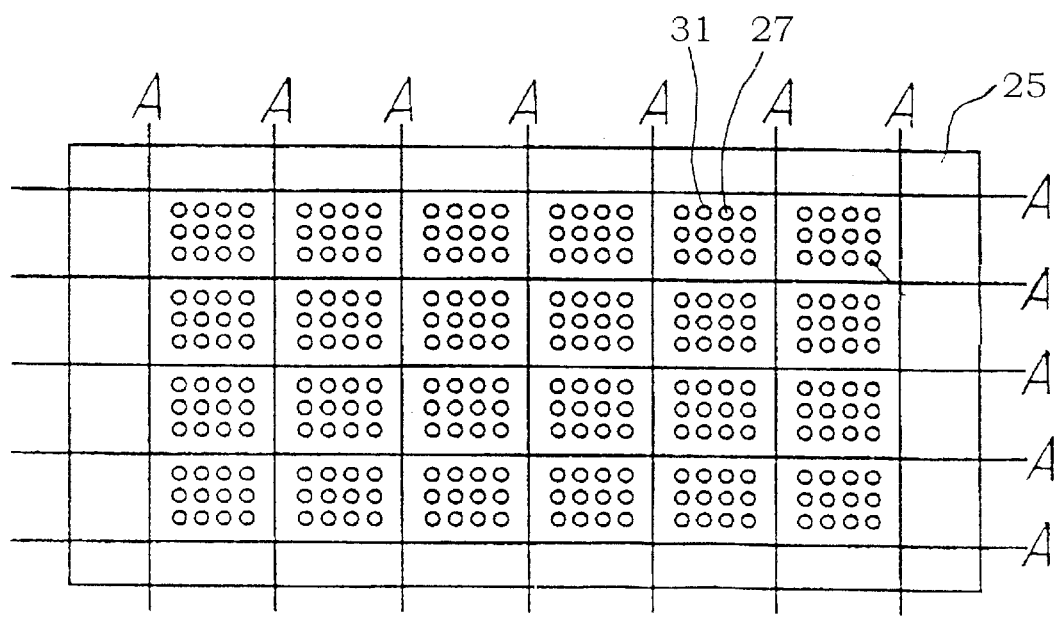

Fig. 13 (a) (Prior Art)
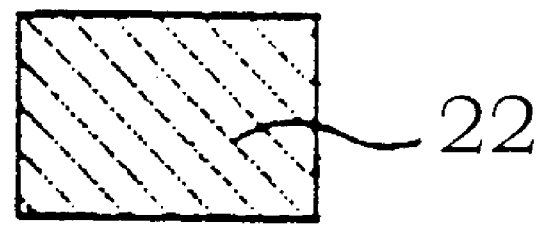
Fig. 13 (b) (Prior Art)
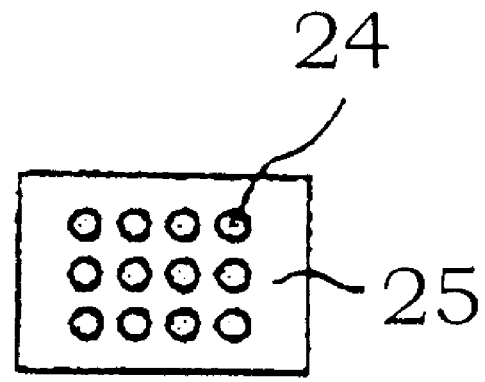

Fig. 14 (a) (Prior Art)
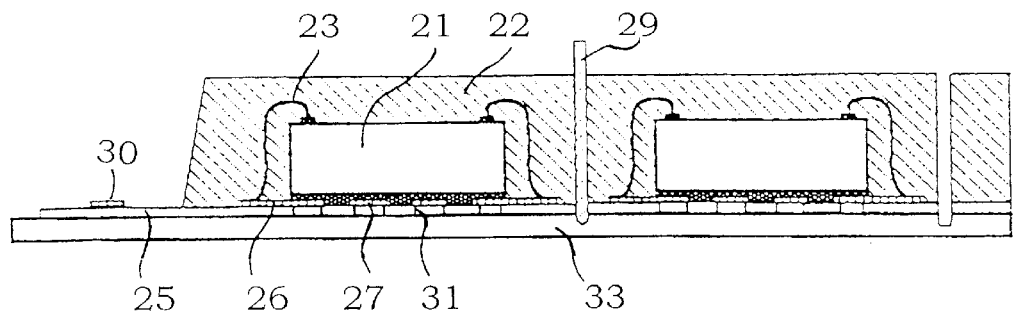
Fig. 14 (b) (Prior Art)
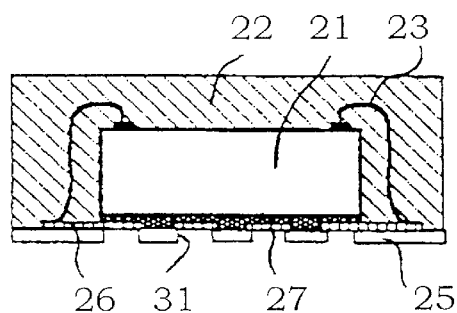
Fig. 14 (c) (Prior Art)
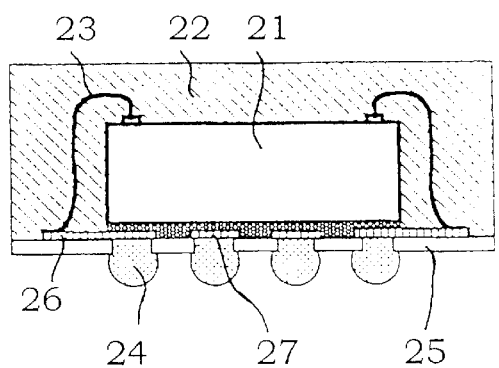

US 6,538,317 B1

SUBSTRATE FOR RESIN-ENCAPSULATED SEMICONDUCTOR DEVICE, RESIN-ENCAPSULATED SEMICONDUCTOR DEVICE AND PROCESS FOR FABRICATING THE SAME

CROSS-REFERENCE TO RELATED APPLICATION

This application is related to Japanese application No. HEI 11-216108 filed on Jul. 30, 1999, whose priority is claimed under 35 USC §119, the disclosure of which is incorporated by reference in its entirety.

BACKGROUND OF THE INVENTION

1. Field of the Invention

The present invention relates to a substrate for a resin-encapsulated semiconductor device, a resin-encapsulated semiconductor device and a process for fabricating the same. More particularly, it relates to a substrate used for a resin-encapsulated semiconductor device of a ball grid array (BGA) type which is called a chip size package (CSP), and a process for fabricating the same.

2. Related Art

Conventionally, resin-encapsulated semiconductor devices of the BGA type called CSP as shown in FIG. 14(c) have been widely utilized.

The resin-encapsulated semiconductor device comprises a wiring substrate 25 for mounting a semiconductor chip which includes thereon a patterned wiring 26, a plurality of first through holes 31 for external connection and a plurality of lands 27 for external connection which cover the entire openings of the first through holes 31 and partially constitute the patterned wiring 26, and a semiconductor chip 21 mounted thereon. The semiconductor chip 21 is electrically connected to the patterned wiring 26 through wire bonding using an Au wire 23. The semiconductor chip 21 and the Au wire 23 are encapsulated with a resin 22 for encapsulation. Further, external terminals 24 for external connection are mounted on a surface opposite to a chip-mounting surface of the wiring substrate 25 and electrically connected to the semiconductor chip 21 via the lands 27.

The resin-encapsulated semiconductor device is fabricated by the following process.

First, as shown in FIGS. 9(a) and 9(b), the first through holes 31 for mounting the external terminals are formed in an area array matrix of the wiring substrate 25. On a surface of the wiring substrate 25 where the semiconductor chips 21 are to be mounted, the patterned wiring 26 and the lands 27 for external connection are formed of a conductive film, and marks 30 representative of cutting lines are formed of the conductive film in the periphery of the wiring substrate 25. The lands 27 partially serve as the patterned wiring 26 and cover the respective first through holes 31.

Then, as shown in FIGS. 10(a) and 10(b), the semiconductor chips 21 are mounted on the wiring substrate 25 and electrically connected to the patterned wiring 26 formed on the wiring substrate 25 through wire bonding using Au wires 23.

Subsequently, as shown in FIGS. 11(a) and 11(b), the semiconductor chips 21 arranged on the wiring substrate 25 and the Au wires 23 are all encapsulated in one-piece with the resin 22 by a transfer mold technique.

Then, as shown in FIGS. 12(a), 12(b), 14(a) and 14(b), the thus encapsulated semiconductor chips 21 are divided into individual chips. At this time, as shown in FIG. 14(a), a surface of the wiring substrate 25 where the external terminals are to be mounted is adhered to a jig 33 for fixing the wiring substrate. The chip-mounting surface of the wiring substrate 25 is faced upward so that the marks 30 of cutting lines can be observed from the chip-mounting surface side of the wiring substrate 25. The cutting line is defined by joining a pair of marks 30 formed on the opposite sides of the periphery of the wiring substrate 25. The resin 22 and the underlying wiring substrate 25 are cut and divided with a single cutting blade 29 along the cutting line in one operation as shown in FIG. 14(b).

Thereafter, as shown in FIGS. 13(a), 13(b) and 14(c), the external terminals 24 are mounted at the first through holes 31 from the external terminal mounting surface and subjected to a reflow process to metallically bond the external terminals 24 and the patterned wiring 26 or the lands 27. Thus, an end product is obtained.

However, in the above-described process, since the wiring substrate 25 encapsulated with the resin 22 is cut and divided into individual products by recognizing the marks 30 indicative of cutting lines provided on the wiring substrate 25 at the circumference of the resin 22, the process for mounting the external terminals 24 is performed after the division of the products. Therefore, the external terminals 24 have to be mounted on the divided resin-encapsulated semiconductor device, respectively, which decreases productivity.

Further, the marks 30 indicative of cutting lines are formed separately from the formation of the first through holes 31 so that the marks and the first through holes tends to be mal-aligned, which makes difficult to control the positional relationship between the edge of the resin 22 and the first through holes 31 after cutting.

In addition, where all the semiconductor chips 21 mounted on the wiring substrate 25 are encapsulated in one-piece with the resin 22, warpage occurs due to the difference in line expansion coefficient among the wiring substrate 25, the resin 22 and the semiconductor chips 21. Further, the greater the contact area of the wiring substrate 25 and the resin 22 is, the greater the warpage of the substrate 25 occurs.

Thus, because of the increase in warpage of the wiring substrate 25, there are problems of difficulties in conveying the wiring substrate 25 or in connecting the external terminals 24 and the lands 27 in the following fabricating process.

Moreover, in the above-described fabrication process, the semiconductor chips 21 encapsulated with the resin 22 on the wiring substrate 25 are divided into individual chips 21 by cutting. That is, the wiring substrate 25 and the resin 22 formed of different materials are cut in one operation with one cutting blade 29. Therefore, the cutting blade 29 is extremely worn out.

Further, since cut faces of the resin 22 and the wiring substrate 25 are in the same plane, the resin 22 and the wiring substrate 25 may be easily separated from each other at an interface therebetween.

SUMMARY OF THE INVENTION

The present invention provides with a substrate for resin-encapsulated semiconductor device comprising a first region for mounting semiconductor chips where a plurality of wiring patterns, a plurality of first through holes for external connection and lands which cover the entire openings of the first through holes and partially constitute the patterned wirings are formed and a second region where the semiconductor chips are not mounted, the first and second regions being formed on the same surface, wherein a plurality of second through holes whose openings are entirely covered with a conductive film are formed in the second region.

Further, the present invention provides with a process for fabricating a resin-encapsulated semiconductor device comprising the steps of: (a) forming a plurality of first through holes for external connection in a first region for mounting a semiconductor chips of a substrate for mounting the semiconductor chips and a plurality of second through holes in a second region where the semiconductor chips are not mounted; (b) forming a conductive film on a chip-mounting surface of the substrate, and patterning the conductive film into a plurality of patterned wirings and a plurality of lands which cover the entire openings of the first through holes and partially constitute the patterned wirings and into a conductive pattern which covers the entire openings of the second through holes; (c) mounting two or more semiconductor chips on the chip-mounting surface of the substrate; (d) mounting external connection terminals at the first through holes from a terminal-mounting surface opposite to the chip-mounting surface and connecting the semiconductor chips to the external terminals through the lands; (e) encapsulating the plural semiconductor chips in one-piece with a resin for encapsulation; and (f) dividing the resulting substrate for the individual semiconductor chips by cutting the substrate and the resin from the terminal-mounting surface of the substrate in this order by defining a cutting position using the second through holes and the conductive pattern.

Still further, the present invention provides with a resin-encapsulated semiconductor device comprising; a substrate for mounting a semiconductor chip including thereon a patterned wiring, a plurality of first through holes for external connection and a plurality of lands which cover the entire openings of the first through holes and partially constitute the patterned wiring, a plurality of semiconductor chips being mounted on the substrate, the semiconductor chips being encapsulated with a resin, and terminals for external connection being mounted on a surface opposite to a chip-mounting surface of the substrate and electrically connected to the semiconductor chips via the lands, wherein the plurality of semiconductor chips are divided into two or more groups and each of the groups is encapsulated in one-piece with a resin.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1(a) to 6(a) are schematic plan views of a semiconductor device observed from the chip-mounting surface and FIGS. 1(b) to 6(b) are schematic plan views of the semiconductor device observed from the external terminal mounting surface for illustrating an example of the process for fabricating a resin-encapsulated semiconductor device according to the present invention.

FIGS. 9(a) to 13(a) are schematic plan views of a semiconductor device observed from the chip-mounting surface and FIGS. 9(b) to 13(b) are schematic plan views of the semiconductor device observed from the external terminal mounting surface for illustrating a conventional process for fabricating a resin-encapsulated semiconductor device.

FIGS. 14(a) to 14(c) are schematic sectional views illustrating the conventional process for fabricating a resin-encapsulated semiconductor device.

DESCRIPTION OF THE PREFERRED EMBODIMENTS

Figure 1:
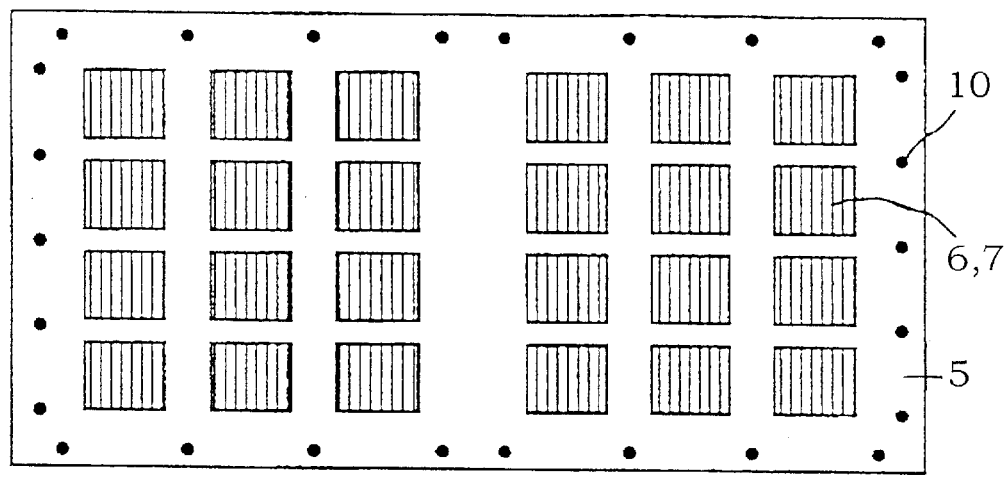
Figure 1:
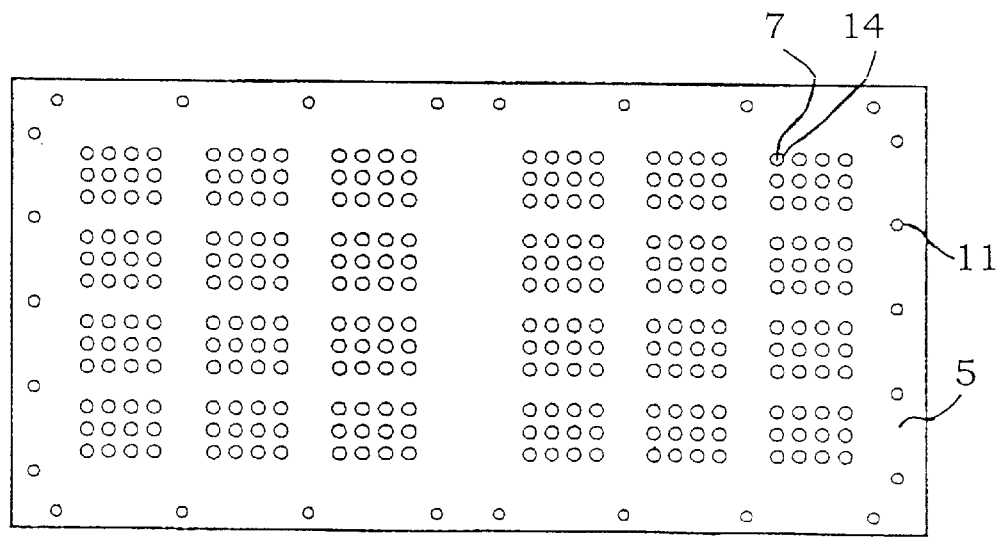

The substrate for the resin-encapsulated semiconductor device of the present invention is a substrate for mounting semiconductor chips of the resin-encapsulated semiconductor device and includes a first region serves as a region for mounting the semiconductor chips and a second region where the semiconductor chips are not mounted on an identical surface thereof. The first region includes a plurality of patterned wirings, a plurality of first through holes for external connection and lands which cover the entire openings of the first through holes and partially constitute the patterned wirings. The second region includes a plurality of second through holes whose openings are entirely covered with a conductive film.

The substrate for the resin-encapsulated semiconductor device is not particularly limited as long as it is commonly used for mounting resin-encapsulated semiconductor devices. Examples thereof include polyimide resins, glass-reinforced epoxy resins, glass, epoxy resins, ceramics and the like. Among these, glass-reinforced epoxy resins and polyimide resins are preferable. The thickness of the substrate is not particularly limited, but a thickness of about 0.1 to 2.0 mm is preferable. The shape of the substrate is not particularly limited, but a rectangular shape is preferable.

The first through holes formed in the first region are used for electrically connecting a semiconductor chip to external terminals. The size, number and arrangement of the through holes are determined as appropriate in accordance with the size of the external terminals; the shape, size and performance of the semiconductor chip or the resin-encapsulated semiconductor device to be obtained and the like. For example, for mounting a semiconductor chip of about 10 mm×10 mm, about 20 to 500 through holes having a diameter of about 0.25 mm to 0.42 mm are preferably formed.

The patterned wirings and the lands are formed of a conductive film. The conductive film may be formed of any material commonly used as an electrode. For example, the conductive film may be a single layer or a laminated layer of metals such as gold, copper, nickel, chromium, tungsten, iron, molybdenum. The thickness of the conductive film may be, for example, about 15 $\mu$m to 30 $\mu$m. The shape, size and number of the patterned wirings and the lands may be determined as appropriate in accordance with the shape, size and performance of the semiconductor chip or the resin-encapsulated semiconductor device to be obtained. Here, the lands need to be patterned to cover the entire openings of the first through holes. Depending on the performance and the like of the semiconductor chip or the resin-encapsulated semiconductor device, the lands may be patterned such that one land covers one first through hole or alternatively one land covers a plurality of first through holes.

The second through holes are formed in a region (a second region) other than the region where the semiconductor chips are mounted. It is preferable that a pair of second through holes is formed symmetrically with respect to a central line in an X direction or a Y direction of a rectangular substrate. More preferably, a plurality of second through hole pairs are provided. In other words, in the rectangular substrate, the second through holes are formed in the internal periphery of the substrate, and preferably formed along the sides of the substrate at even intervals (for example, intervals slightly greater than the length of a side of a semiconductor chip to be mounted) so that one semiconductor chip is located in a region defined by four lines provided by joining second through hole pairs formed along the opposite sides of the substrate. The size of the second through holes may be the same as or different from that of the first through holes as long as they can be recognized as the marks.

Further, the openings of the second through holes need to be completely covered with a conductive pattern. The conductive pattern can be formed of a conductive film of the same kind as the above-described conductive film. The conductive pattern is preferably formed of the same conductive film as the film constituting the patterned wirings and the lands.

According to the process for fabricating the resin-encapsulated semiconductor device of the present invention, a plurality of first through holes for external connection are formed in the first region for mounting semiconductor chips of a substrate for mounting semiconductor chips and a plurality of second through holes are formed in the second region where the semiconductor chips are not mounted in the step (a).

The first and second through holes can be formed by a known technique, for example, sputtering or the like using a mask formed by photolithography and etching. The first and second through holes may be formed individually, but may preferably be formed simultaneously in terms of positioning therebetween and simplification of the process.

In the step (b), a conductive film is formed on a chip-mounting surface of the substrate. The conductive film is patterned into a plurality of patterned wirings, a plurality of lands which entirely cover the openings of the first through holes and partially constitute the patterned wirings and a conductive pattern which covers the entire openings of the second through holes. The patterned wirings, the lands and the conductive pattern may be formed by a known patterning technique such as photolithography and etching.

In the step (c), two or more semiconductor chips are mounted on the chip-mounting surface of the substrate.

The semiconductor chips need to be mounted on the substrate by using an adhesive such as epoxy resin so that wirings, terminals such as pad electrodes formed on the front or the rear surface of the chips can be electrically connected to the patterned wirings, lands and the like formed on the substrate. For example, the terminals on the semiconductor chips can be connected to the lands on the substrate through an adhesive containing a conductive material, and connected to the patterned wirings on the substrate through wire bonding using wires such as of gold, copper and the like.

In the step (d), the external terminals are mounted at the first through holes from a surface opposite to the chip-mounting surface of the substrate and electrically connected to the semiconductor chips via the lands. The electrical connection between the external terminals and the semiconductor chips may be realized by mounting or inserting the external terminals on or into the first through holes and then subjecting to a reflow process for metallic bonding therebetween. In order to take such a step, the external terminals are suitably in a ball form, cylindrical form or prism form made of a material such as solder, Au or the like. The external terminals preferably have a size greater than the thickness of substrate, i.e., a size such that the external terminals penetrate the first through holes at a final stage.

In the step (e), two or more semiconductor chips are encapsulated in one-piece with the resin for encapsulation. The resin encapsulation may be achieved by encapsulating all the semiconductor chips mounted on the substrate in one-piece or by dividing the plural semiconductor chips on the substrate into groups of two or more and then encapsulating the individual groups in one-piece. The division of the semiconductor chips into groups and the resin encapsulation thereof can prevent warpage of the substrate as compared with the case where all the semiconductor chips are encapsulated in one-piece with a resin. In such a case where the semiconductor chips are divided into groups and each of the groups is encapsulated with a resin, it is preferable that a gap between the semiconductor chip groups individually encapsulated in one-piece with the resin is perpendicular to a lengthwise direction of the substrate.

The method of the resin encapsulation may be a common method such as a method in which a mold having a cavity of a predetermined shape is used, or a method of flowing or applying the resin onto the substrate on which the semiconductor chips are mounted. The resin is not particularly limited, but may preferably be a material which does not damage the semiconductor chips, the wirings patterned on the substrate, the bonding wires and the like. Preferable examples thereof include a material which melts at a low temperature, a material having suitable viscosity and/or a material which cures in a suitable period under suitable conditions. More specifically, epoxy resin and the like are used. The thickness of the resin can be adjusted as appropriate in accordance with the size of the semiconductor chips or the semiconductor device to be obtained, but suitably be a thickness of about 0.4 mm to 1.0 mm from the substrate surface, for example.

In the step (f), the substrate and the resin are cut in this order from the external terminal mounting surface by defining the cutting position with the second through holes and the conductive pattern. That is, the second through holes and the conductive pattern covering the entire openings of the second through holes serve as marks indicative of cutting positions, thereby the cutting positions can be defined. The recognition of the marks of cutting positions can be realized by a known technique commonly used in the art.

The substrate is divided for individual chips by cutting the substrate from the terminal-mounting surface of the substrate. For the cutting, the substrate and the resin are cut successively in this order in one operation or two or more operations. Preferably, the substrate is cut first with a first cutting blade. Then, the resin is cut with a second cutting blade thinner than the first cutting blade.

The first cutting blade is used only for cutting the substrate, and preferably, more suitable for cutting the substrate than for cutting the resin. More specifically, the first cutting blade is a disc-shaped rotating member in which abrasive grains of a predetermined particle size are fixed on the outside circumference thereof. An example thereof includes a blade typically used in a dice cutting technique.

Examples of abrasive grains include diamond and the like, having an average diameter of about 20 μm to 60 μm. The disc-shaped rotating member itself is preferably made of a relatively hard metal or diamond. The thickness of the first cutting blade is, for example, about 120 μm to 250 μm.

Where the first cutting blade is used to cut the substrate, it is generally preferable to fix the chip-mounting surface of the substrate, i.e., the resin side, with a jig or the like, and cut the substrate from the terminal-mounting surface by recognizing and using the second through holes as reference marks indicative of cutting positions. Accordingly, the substrate can be precisely cut to have a predetermined shape from the terminal-mounting surface side. Further, the first cutting blade is preferably stopped at an interface between the substrate and the resin so that only the substrate is cut.

The second cutting blade is a blade mainly for cutting the resin, and preferably, more suitable for cutting the resin than for cutting the substrate. More specifically, the second cutting blade is a disc-shaped rotating member in which abrasive grains having a greater particle size than those on the first cutting blade are fixed on the outside circumference thereof. An example thereof includes a blade typically used in the dice cutting technique. The abrasive grains may have a particle size of about 20 μm to 60 μm. Materials for the abrasive grains and the rotating member may be the same as those used for the first cutting blade. The thickness of the second cutting blade is preferably thinner than the first cutting blade, for example, about 100 μm to 200 μm.

Where the second cutting blade is used to cut the resin, it is preferable to cut it where the substrate has been cut with the first cutting blade (where the resin has been exposed) from the terminal-mounting surface, so that only the resin is cut.

In the present invention, however, the cutting with the first cutting blade and the cutting with the second cutting blade may be reversed. More specifically, the substrate and the resin are cut first with the second cutting blade from the terminal-mounting surface of the substrate and then only the substrate is cut again with the first cutting blade where the second cutting blade has cut.

Accordingly, the cut faces of the substrate and the resin are prevented from constituting the same plane. That is, the outer circumference of the resin in which the semiconductor chip is encapsulated is larger than that of the substrate on which the semiconductor chip is mounted. The distance between the edge of the substrate and the edge of the resin may be about 20 μm to 50 μm, for example. In other words, the area of the substrate on which the semiconductor chip may be mounted assumes about 80% to 90% of the area occupied by the resin-encapsulated semiconductor device, and the edge of the substrate is preferably positioned inside the edge of the semiconductor device.

These steps allow the division of the obtained substrate for individual semiconductor chips, and in addition, the cut faces of the substrate and the resin are prevented from constituting the same plane.

Hereinafter, the substrate for the resin-encapsulated semiconductor device, the resin-encapsulated semiconductor device and the fabrication process thereof according to the present invention will be explained with reference to the drawings.

As shown in FIGS. 1(a) and 1(b), the substrate for the resin-encapsulated semiconductor device of the present invention includes second through holes whose openings are entirely covered with a conductive pattern 10 and which are formed in a region (a second region) other than a first region for mounting semiconductor chips 1. The second through holes and the conductive pattern 10 serve as marks indicative of cutting lines on an external terminal mounting surface opposite to a chip-mounting surface. Since the substrate 5 is rectangular, the second through holes are formed in pairs located symmetrically with respect to a central line in an X direction or a Y direction of the wiring substrate 5. A plurality of second through hole pairs are formed.

The second through holes are formed simultaneously with the formation of the first through holes. Accordingly, the fabrication process is prevented from being multiplied and the first and second through holes are prevented from being malaligned without any alignment process. Therefore, positional relationship between the edge of the resin 2 for encapsulation and the semiconductor chip 1 in a final product can surely be controlled.

Figure 3:
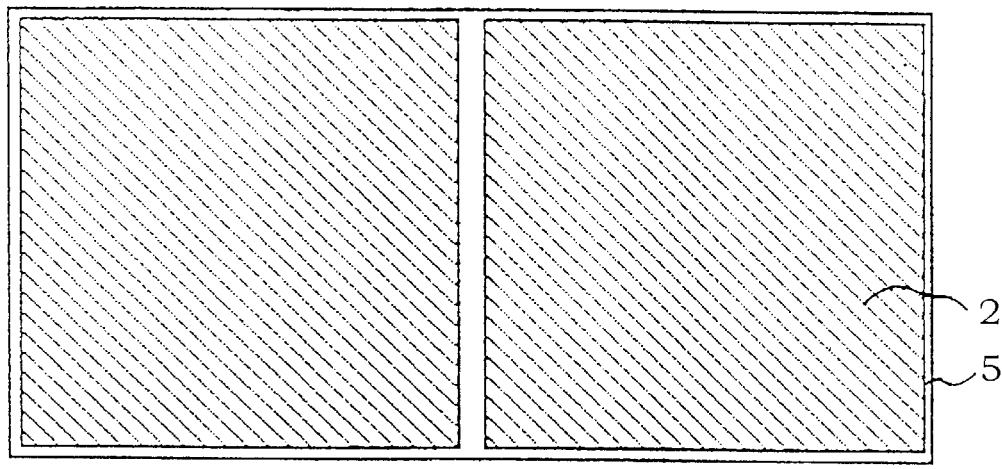
Figure 3:
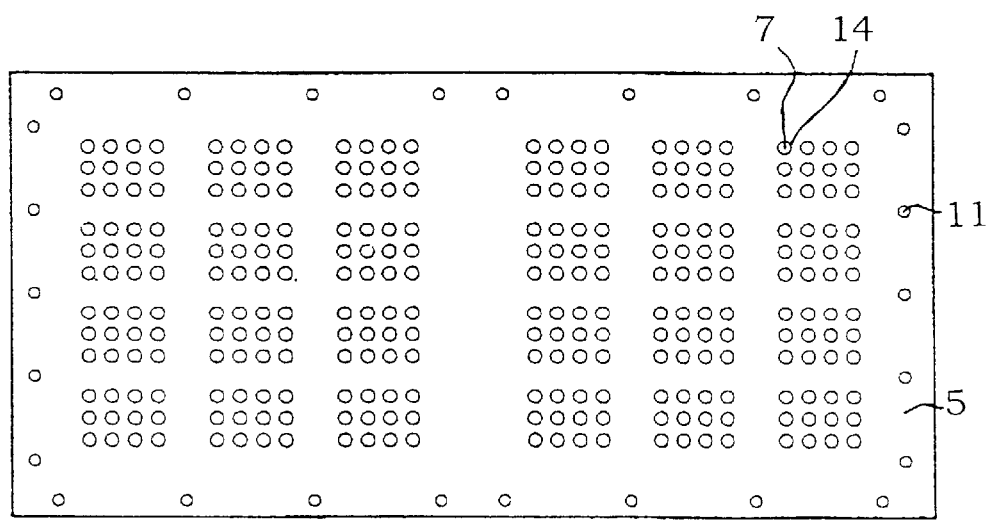

In the resin-encapsulated semiconductor device according to the present invention, the semiconductor chips 1 divided into two groups and each groups is encapsulated in one-piece with a resin as shown in FIG. 3(a). A gap between the encapsulated semiconductor chip groups is formed perpendicular to a lengthwise direction of the wiring substrate 5. The resin encapsulation in such a state can prevent warpage of the wiring substrate.

The above-described substrate for the resinen-capsulated semiconductor device and the resin-encapsulated semiconductor device are fabricated by the following steps.

First, as shown in FIGS. 1(a) and 1(b), a plurality of first through holes 14 for mounting the external terminals are formed in an area array matrix in the first region of the wiring substrate 5 of polyimide resin, and second through holes 11 which serve as marks indicative of cutting positions in a later step are formed in the second region of the wiring substrate 5. Then, a conductive film is entirely formed on a chip-mounting surface, and the patterned wiring 6 and the lands 7 for external connection which partially constitute the patterned wiring 6 are formed. Simultaneously, a conductive pattern 10 is formed to cover the entire openings of the second through holes 11. The conductive pattern 10 prevents leakage of the resin 2 from the second through holes 11 in a later step, thereby facilitating the recognition of the cutting lines.

Figure 2:
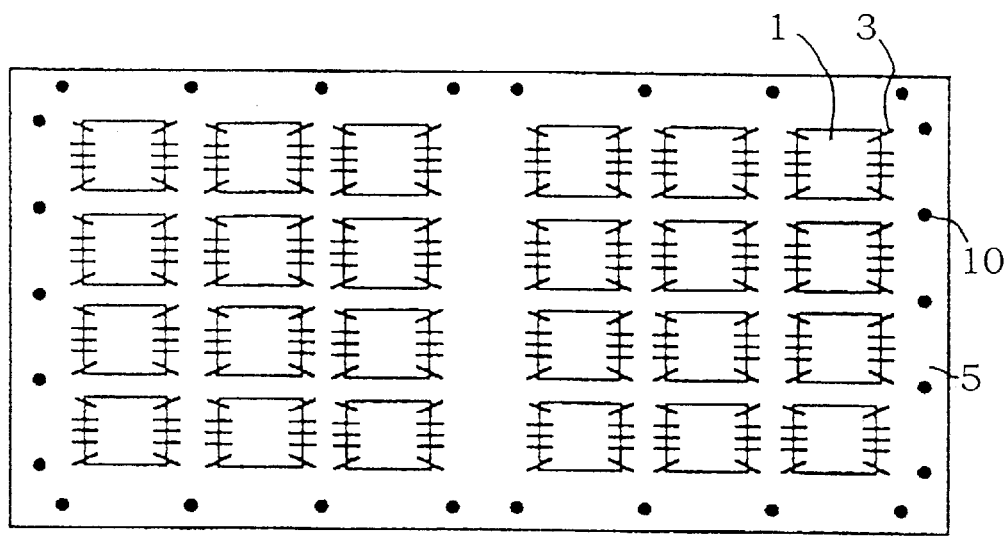
Figure 2:
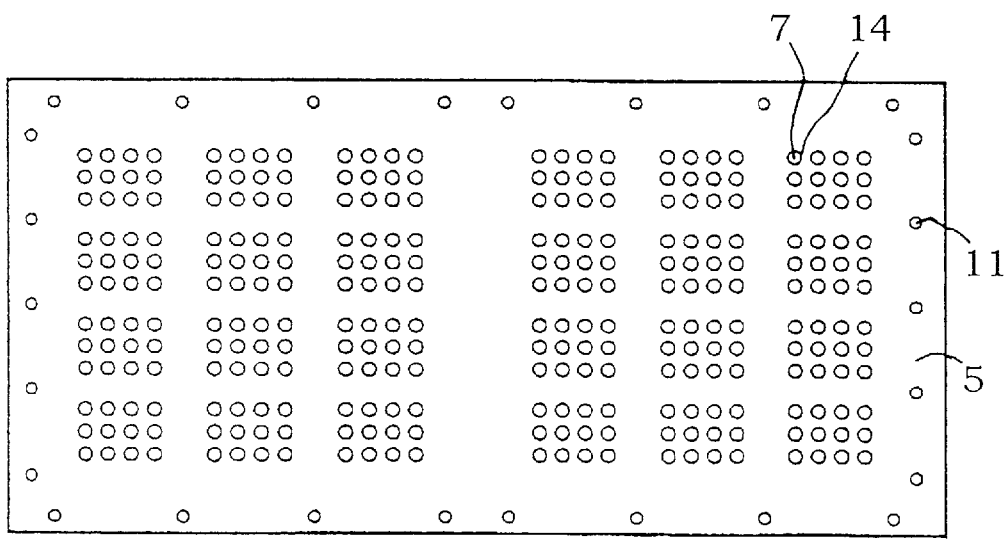

Next, as shown in FIGS. 2(a) and 2(b), the semiconductor chips 1 are adhered to the wiring substrate 5 with an adhesive paste or film (for example, polyimide). Then, the resulting substrate 5 adhered with the chips 1 is entirely heated at a predetermined temperature (ex., 200° C.) for a predetermined period (ex., 60 minutes). Then, the heated substrate 5 with the chips 1 is washed by plasma treatment to modify the surface property thereof so that the stability of the wire bonding is improved. Subsequently, electrode pads (not shown) of the semiconductor chips 1 are connected to terminals (not shown) of the patterned wiring 6 through the Au wires 3.

Then, as shown in FIGS. 3(a) and 3(b), the semiconductor chips 1 and the Au wires 3 are encapsulated with the resin 2 of epoxy resin by a transfer mold technique.

Figure 8:
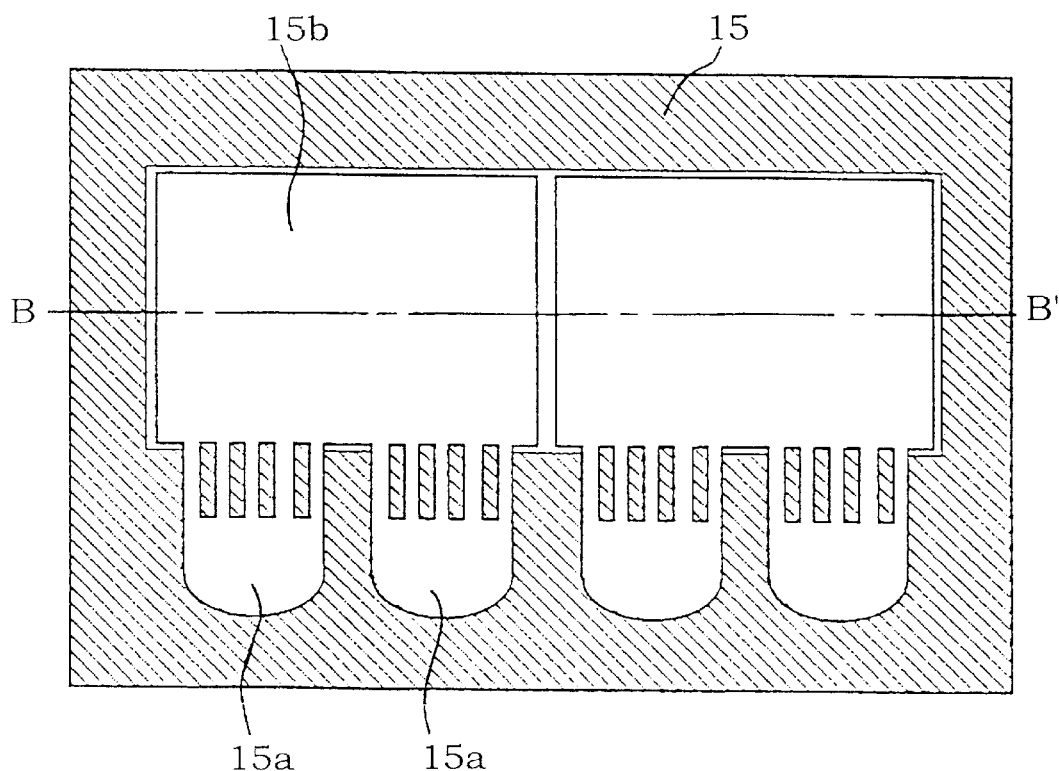
FIG. 8(a) is a plan view illustrating a mold for resin encapsulation used in the example of the process for fabricating the resin-encapsulated semiconductor device according to the present invention.
FIG. 8(b) is a sectional view of FIG. 8(a) taken along section line B—B'.
Figure 8:
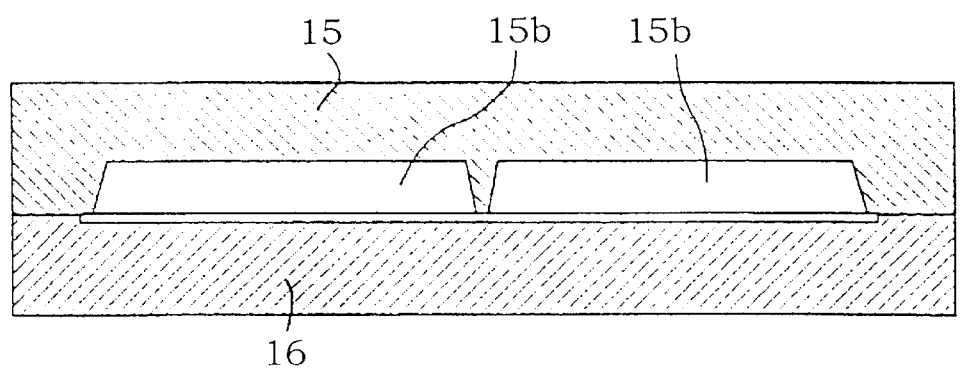

At this time, as shown in FIGS. 8(a) and 8(b), the wiring substrate 5 is sandwiched and fixed between a holding member 16 and a mold 15 whose inside is divided into two spaces 15b. Thus, the semiconductor chips 1 mounted on the wiring substrate 5 are divided into two groups and each of the groups is encapsulated in one operation by injecting the resin 2 from spaces 15a to the spaces 15b.

Thereafter, the resin-encapsulated wiring substrate 5 is heated at a predetermined temperature (ex., 175° C.) for a predetermined period (ex., 300 minutes). Further, in order to inhibit warpage of the semiconductor device, it is preferable that a gap between the two resin 2 and 2 (where the wiring substrate 5 is exposed) is perpendicular to a lengthwise direction of the wiring substrate 5.

Figure 4:
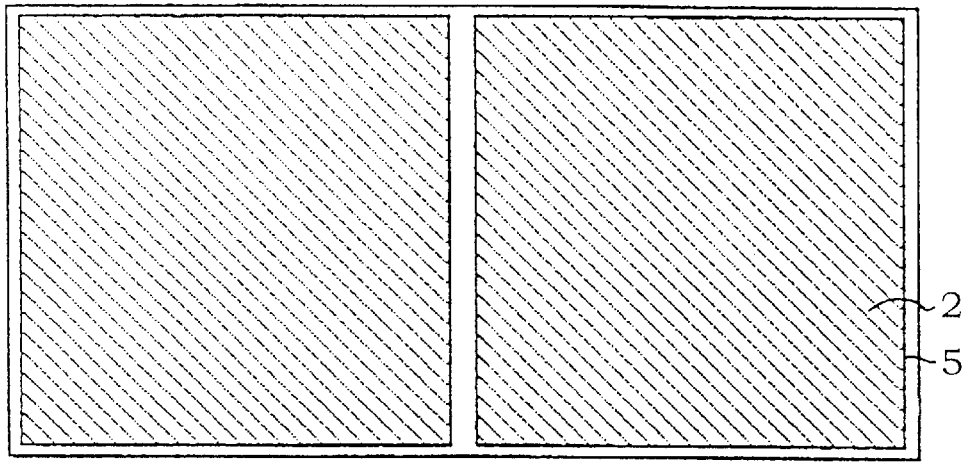
Figure 4:
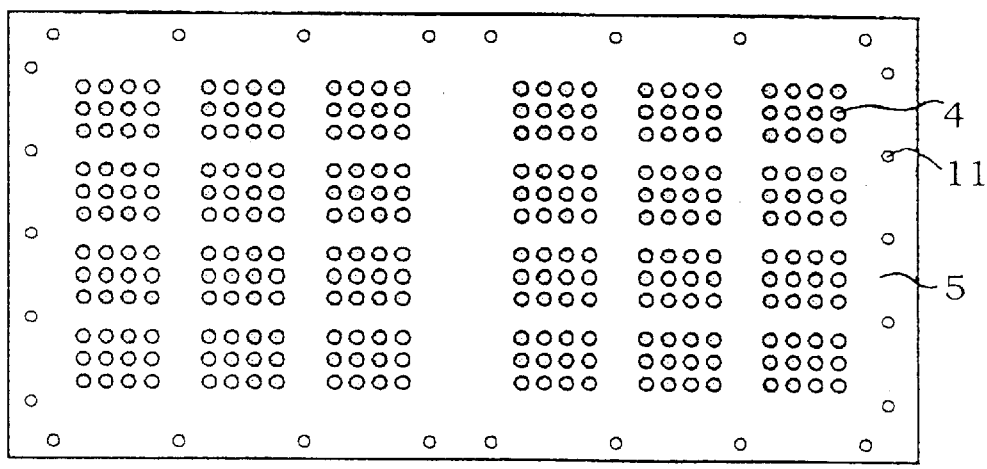
Figure 5:
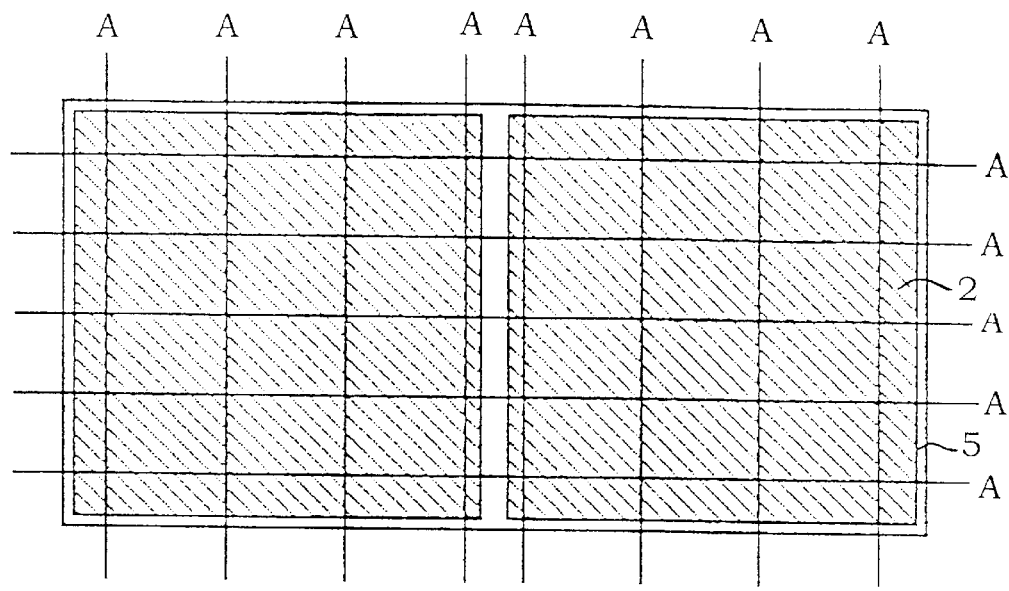
Figure 5:
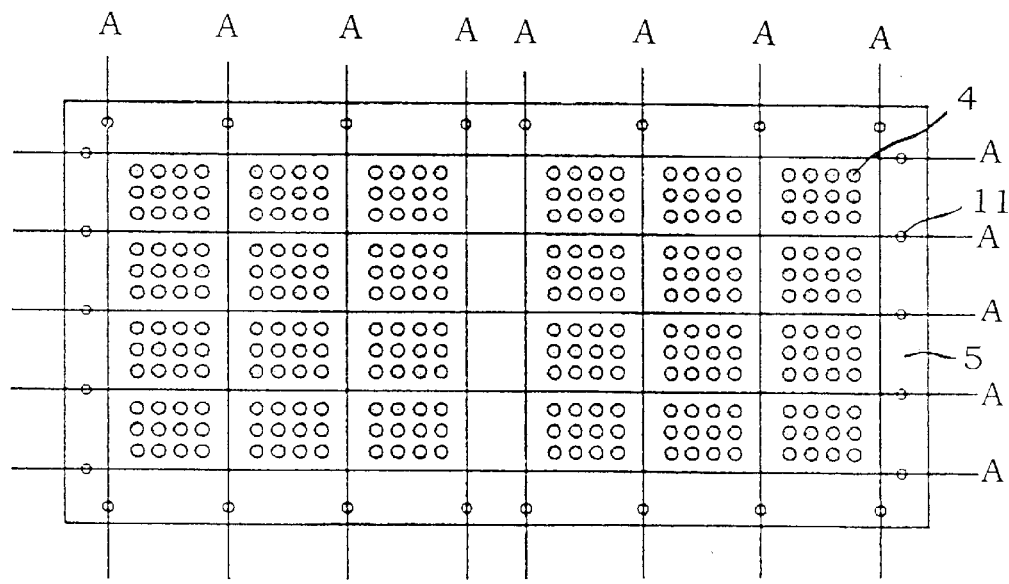

Then, as shown in FIGS. 4(a) and 4(b), the external terminals 4 are mounted at all of the first through holes 14 from a chip-mounting surface of the wiring substrate 5 in one operation. Subsequently, the external terminals 4 and the lands 7 are metallically bonded by a reflow process.

Then, as shown in FIGS. 5(a), 5(b), 7(a) and 7(b), the terminal-mounting surface of the wiring substrate 5 is faced upward and the resin side of the wiring substrate 5 is adhered to a jig 13 for fixing the substrate. Subsequently, from the terminal-mounting surface, the marks of cutting positions comprised of the conductive patterns 10 and the second through holes 11 are observed. Lines A provided by joining pairs of marks formed at opposite edges of the wiring substrate 5 are defined as cutting lines. Then the resin 2 and the wiring substrate 5 are cut with cutting blades 8 and 9 along the lines A.

For the cutting, only the wiring substrate 5 is cut first with the first cutting blade 8 and then only the resin 2 is cut with the second cutting blade 9 at positions where the wiring substrate 5 has been cut, thereby to divide into the individual semiconductor chips 1.

The first cutting blade 8 used herein is suitable for cutting the wiring substrate 5 and comprises a rotating member of diamond provided with abrasive diamond grains having an average particle size of 8 μm. The thickness of the blade is 200 μm. The second cutting blade 9 is suitable for cutting the resin 2 and comprises a rotating member of diamond provided with abrasive diamond grains having an average particle size of 20 μm. The thickness thereof is thinner than the first cutting blade 8 (150 μm).

Figure 6:
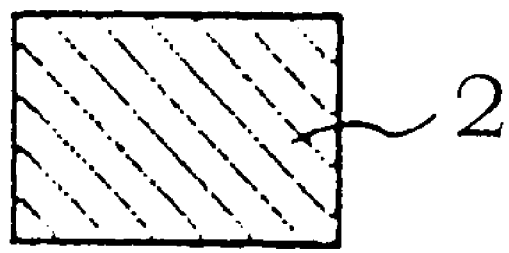
Figure 6:
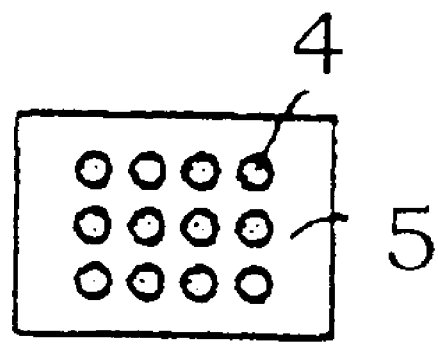
Figure 7:
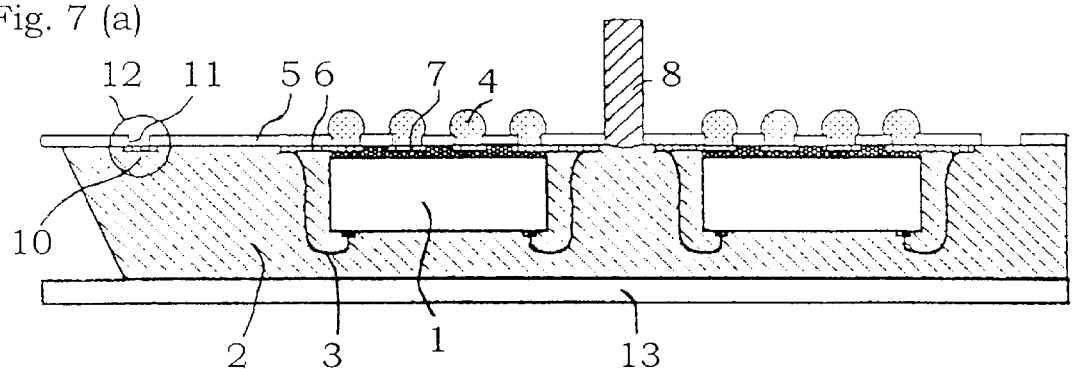
FIGS. 7(a) to 7(c) are schematic sectional views of the semiconductor device for illustrating the example of the process for fabricating the resin-encapsulated semiconductor device according to the present invention.
Figure 7:
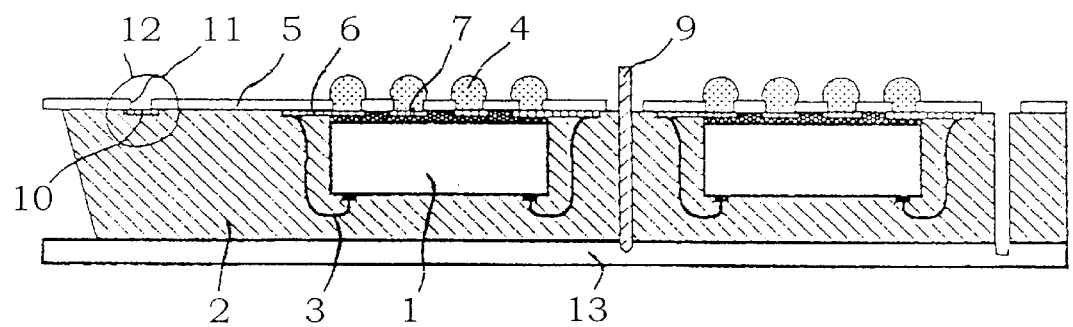
Figure 7:
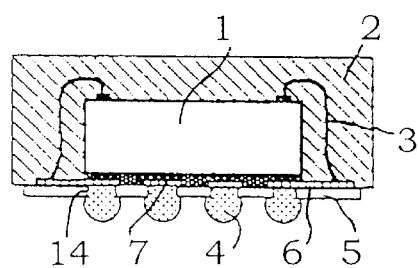

Then, as shown in FIGS. 6(a), 6(b) and 7(c), resin-encapsulated semiconductor devices thus divided individually are detached from the jig 13 for fixing the substrate, and end products are obtained.

According to the substrate for the resin-encapsulated semiconductor device of the present invention, the second through holes whose openings are entirely covered with the conductive pattern are formed so that the cutting lines can be surely observed and defined from the terminal-mounting surface, thereby a distance between the first through holes and the edge of the semiconductor chip can be precisely controlled. Additionally, since the second through holes are covered with the conductive pattern, the leakage of the resin encapsulant from the second through holes at the resin encapsulation in a later step can be prevented.

In particular, where the substrate is rectangular and provided with a plurality of second through hole pairs formed symmetrically with respect to a central line in an X direction or a Y direction of the substrate, the distance between the first through holes and the edge of the semiconductor chip can be controlled more accurately.

According to the process for fabricating the resin-encapsulated semiconductor device of the present invention, a plurality of second through holes are formed in the second region where the semiconductor chips are not mounted simultaneously with the formation of the first through holes. Further, the conductive pattern which covers the entire openings of the second through holes is formed simultaneously with the formation of the wiring patterns and the lands. Therefore, the marks indicative of cutting lines observable from the terminal-mounting surface can be formed without an additional process. Accordingly, the distance between the first through holes and the edge of the semiconductor chip can be precisely controlled, and thereby productivity and yield can be improved and production costs are reduced.

In particular, where a plurality of semiconductor chips are divided into two or more groups which are each encapsulated in one-piece with a resin, warpage of the obtained resin-encapsulated semiconductor devices can be reduced.

Further, the substrate is cut with the first cutting blade from the terminal-mounting surface and the resin is cut with the second cutting blade thinner than the first cutting blade at a position where the substrate has been cut, so that the cut faces of the substrate and the resin do not assume the same plane. This enables a facilitated fabrication of resin-encapsulated semiconductor devices which are adapted to prevent or inhibit exfoliation of the substrate from the resin.

Where the first cutting blade is more suitable for cutting the substrate than for cutting the resin and the second cutting blade is more suitable for cutting the resin than for cutting the substrate, more specifically, where the first cutting blade is a disc-shaped rotating member provided with abrasive grains having a predetermined particle size and the second cutting blade is a disc-shaped rotating member provided with abrasive grains having a particle size greater than those of the first cutting blade, the conventional problem of cutting blades being worn out can be reduced and production costs can also be reduced.

What is claimed is:

1. A substrate for a resin-encapsulated semiconductor device comprising:

a one-piece substrate including a first region for mounting a plurality of semiconductor chips in which a plurality of patterned wirings, a plurality of first through holes for external connection and lands which cover the entire openings of the first through holes and partially constitute the patterned wirings are formed, the substrate further including a second region in which the semiconductor chips are not mounted, the first and second regions being formed on the same surface, wherein the second region is provided with a plurality of separate and spaced apart second through holes whose openings are entirely covered with respective conductive films, wherein said conductive films are not in electrical communication with any of said chips.

2. A substrate according to claim 1, wherein the substrate is rectangular and a plurality of second through hole pairs are formed symmetrically with respect to a central line in an X direction or a Y direction of the substrate.

3. The substrate of claim 1, wherein said second through holes covered with the conductive films are used for cutting marks, and the conductive films are in contact with said resin and prevent said resin from leaking through to the other side of said substrate.

4. The substrate of claim 1, wherein said conductive films covering said second through holes are entirely covered on one side thereof with resin that encapsulates the chips.

5. A resin-encapsulated semiconductor device comprising:

a substrate for mounting a semiconductor chip including, the substrate including thereon a patterned wiring, a plurality of first through holes for external connection and a plurality of lands which cover the entire openings of the first through holes and partially constitute the patterned wiring, a plurality of semiconductor chips being mounted on the substrate, the semiconductor chips being encapsulated with a resin, terminals for external connection being mounted on a surface opposite to a chip-mounting surface of the substrate and electrically connected to the semiconductor chips via the lands, wherein the plurality of semiconductor chips are divided into at least first and second groups and each of the groups is encapsulated in one-piece with a resin so that a first piece of resin encapsulates said first group of semiconductor chips and a different second piece of resin spaced from said first piece of resin encapsulates said second group of semiconductor chips, and each of said first and second pieces of resin is at least partially surrounded with cutting marks of second through holes so that said first and second pieces of resin are cut into pieces when said first and second groups of chips are divided into individual chip structures, and wherein the second through holes are entirely covered with respective conductive films, wherein said conductive films are not in electrical communication with any of said chips.

6. A resin-encapsulated semiconductor device according to claim 5, wherein a gap between the first and second semiconductor chip groups separates said first and second resin pieces and is perpendicular to a lengthwise direction of the substrate.

7. The device of claim 5, wherein at least one of said cutting marks includes an aperture formed in the substrate, the aperture being covered by a conductive film which in turn is completely covered by the resin.

* * * * *